(12) United States Patent
Greene et al.

(10) Patent No.: US 10,622,482 B2
(45) Date of Patent: Apr. 14, 2020

(54) GATE CUT USING SELECTIVE DEPOSITION TO PREVENT OXIDE LOSS

(71) Applicant: INTERNATIONAL BUSINESS MACHINES CORPORATION, Armonk, NY (US)

(72) Inventors: Andrew M. Greene, Albany, NY (US); Ekmini Anuja De Silva, Slingerlands, NY (US); Siva Kanakasabapathy, Pleasanton, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/402,343

(22) Filed: May 3, 2019

(65) Prior Publication Data
US 2019/0259665 A1    Aug. 22, 2019

Related U.S. Application Data

(62) Division of application No. 15/841,887, filed on Dec. 14, 2017, now Pat. No. 10,347,540.

(51) Int. Cl.
*H01L 29/417* (2006.01)
*H01L 29/78* (2006.01)
(Continued)

(52) U.S. Cl.
CPC .... *H01L 29/7856* (2013.01); *H01L 21/28247* (2013.01); *H01L 21/32139* (2013.01); *H01L 21/823431* (2013.01); *H01L 21/823437* (2013.01); *H01L 21/823462* (2013.01); *H01L 21/823821* (2013.01);
(Continued)

(58) Field of Classification Search
CPC ..... H01L 21/823431; H01L 21/823437; H01L 21/823462; H01L 21/823821; H01L 21/823828; H01L 21/823857; H01L 27/0886; H01L 27/092; H01L 27/0924; H01L 27/10826; H01L 27/10879; H01L 27/1211; H01L 27/41791; H01L 27/66772; H01L 27/66795; H01L 27/7831;
(Continued)

(56) References Cited

U.S. PATENT DOCUMENTS 6,297,169 B1    10/2001   Mangat et al.
6,518,168 B1    2/2003    Clem et al.
(Continued)

OTHER PUBLICATIONS

Hausmann, "Atomic Layer Deposition of Hafnium and Zirconium Oxides Using Metal Amide Precursors", Chem. Mater. 2002, vol. 14, No. 10, Sep. 21, 2002, pp. 4350-4358.
(Continued)

*Primary Examiner* — Eduardo A Rodela
(74) *Attorney, Agent, or Firm* — Tutunjian & Bitetto, P.C.; Vazken Alexanian

(57) ABSTRACT

Semiconductor devices include a semiconductor fin. A gate stack is formed over the semiconductor fin. Source and drain regions are formed at respective sides of the gate stack. A dielectric line is formed parallel to the gate stack. An interlayer dielectric is formed between the gate stack and the dielectric line. A top surface of the interlayer dielectric between the gate stack and the dielectric line is not recessed.

16 Claims, 5 Drawing Sheets

(51) Int. Cl.
| | |
|---|---|
| *H01L 29/66* | (2006.01) |
| *H01L 21/3213* | (2006.01) |
| *H01L 21/28* | (2006.01) |
| *H01L 21/8234* | (2006.01) |
| *H01L 21/8238* | (2006.01) |
| *H01L 27/088* | (2006.01) |
| *H01L 27/092* | (2006.01) |
| *H01L 27/108* | (2006.01) |
| *H01L 27/12* | (2006.01) |
| *H01L 21/02* | (2006.01) |
| *H01L 21/32* | (2006.01) |
| *H01L 21/321* | (2006.01) |

(52) U.S. Cl.
CPC ........... *H01L 21/823828* (2013.01); *H01L 21/823857* (2013.01); *H01L 27/0886* (2013.01); *H01L 27/092* (2013.01); *H01L 27/0924* (2013.01); *H01L 27/10826* (2013.01); *H01L 27/10879* (2013.01); *H01L 27/1211* (2013.01); *H01L 29/41791* (2013.01); *H01L 29/66795* (2013.01); *H01L 29/785* (2013.01); *H01L 21/0228* (2013.01); *H01L 21/02181* (2013.01); *H01L 21/02274* (2013.01); *H01L 21/32* (2013.01); *H01L 21/321* (2013.01); *H01L 21/823481* (2013.01); *H01L 27/1207* (2013.01)

(58) Field of Classification Search
CPC . H01L 27/785; H01L 27/7856; H01L 27/786; H01L 2924/13067
See application file for complete search history.

(56) References Cited

U.S. PATENT DOCUMENTS

| | | | |
|---|---|---|---|
| 7,790,631 | B2 | 9/2010 | Sharma et al. |
| 7,879,730 | B2 | 2/2011 | Naser-Ghadsi et al. |
| 8,084,087 | B2 | 12/2011 | Bent et al. |
| 9,595,473 | B2 | 3/2017 | Chen et al. |
| 10,038,079 | B1* | 7/2018 | Ohtou ............... H01L 29/66795 |
| 10,084,053 | B1* | 9/2018 | Xie ................. H01L 21/823481 |
| 10,263,090 | B2* | 4/2019 | Lin ................. H01L 21/823481 |
| 2009/0298296 | A1 | 12/2009 | Burdinski |
| 2016/0111425 | A1* | 4/2016 | Chen ................... H01L 27/0922 257/369 |
| 2017/0062421 | A1 | 3/2017 | Cosemans et al. |
| 2018/0069000 | A1* | 3/2018 | Bergendahl ......... H01L 27/0886 |
| 2018/0308769 | A1* | 10/2018 | Chang ............ H01L 21/823481 |

OTHER PUBLICATIONS

Love, "Self-Assembled Monolayers of Thiolates on Metals as a Form of Nanotechnology", Chem. Rev. 2005, vol. 105, No. 4, Mar. 25, 2005, pp. 1103-1170.
List of IBM Patents or Patent Applications Treated as Related dated May 3, 2019, 2 pages.

* cited by examiner

GATE CUT USING SELECTIVE DEPOSITION TO PREVENT OXIDE LOSS

BACKGROUND

Technical Field

The present invention generally relates to semiconductor device fabrication and, more particularly, to transistor fabrication using gate-cut processes.

Description of the Related Art

The amount by which a gate structure extends past a last fin in a replacement metal gate fabrication process is an important dimension for logic scaling. Multiple voltage-threshold thickness differences in p-type and n-type field effect transistors (FETs) can limit the work function metal coverage of the end fin and can impede electrostatic control of the channel. In particular, the material of the gate stack accumulates on both the final fin and on other nearby structures, such that the gate stack on the sidewalls of the fin may meet and merge with the gate stack forming on the other structures.

To account for this, an etch of the gate stack is often used after the formation of an inter-layer dielectric to ensure that extraneous gate stack material is removed. This process uses an aggressive anisotropic plasma etch to maintain a vertical sidewall of the nearby structures (e.g., electrical contact structures). However, exposed interlayer dielectric material is attacked by the aggressive etch, which can result in a recess in this material. If the interlayer dielectric is recessed by a significant amount (e.g., greater than about 7 nm), conductive interconnect strapping can be blocked due to residual material blocking the needed etches.

SUMMARY

A semiconductor device includes a semiconductor fin. A gate stack is formed over the semiconductor fin. Source and drain regions are formed at respective sides of the gate stack. A dielectric liner is formed parallel to the gate stack. An interlayer dielectric is formed between the gate stack and the dielectric liner. A top surface of the interlayer dielectric between the gate stack and the dielectric liner is not recessed.

A semiconductor device includes a semiconductor fin. A gate stack is formed over the semiconductor fin and includes a gate dielectric layer and a gate conductor. Source and drain regions are formed at respective sides of the gate stack. A dielectric liner is formed parallel to the gate stack and includes a bottom layer formed from a same material as the gate dielectric layer and a top layer formed from a second dielectric material. An interlayer dielectric is formed between the gate stack and the dielectric liner. A top surface of the interlayer dielectric between the gate stack and the dielectric liner is not recessed.

A semiconductor device includes a semiconductor fin. A gate stack is formed over the semiconductor fin and includes a gate dielectric layer and a gate conductor. Source and drain regions are formed at respective sides of the gate stack. A dielectric liner is forming parallel to the gate stack and includes a bottom layer, formed from a same material as the gate dielectric layer and conformally on the semiconductor fin and on sidewalls of the interlayer dielectric, and a top layer, formed from a second dielectric material. An interlayer dielectric is formed between the gate stack and the dielectric liner. A top surface of the interlayer dielectric between the gate stack and the dielectric liner is not recessed.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention form a protective layer on an interlayer dielectric that prevents a subsequent gate cut etch from damaging the dielectric material. To selectively apply the protective layer, such that it does not also cover the gate stack, a protective monolayer is formed on the gate stack that prevents the protective layer from adhering.

Figure 1:
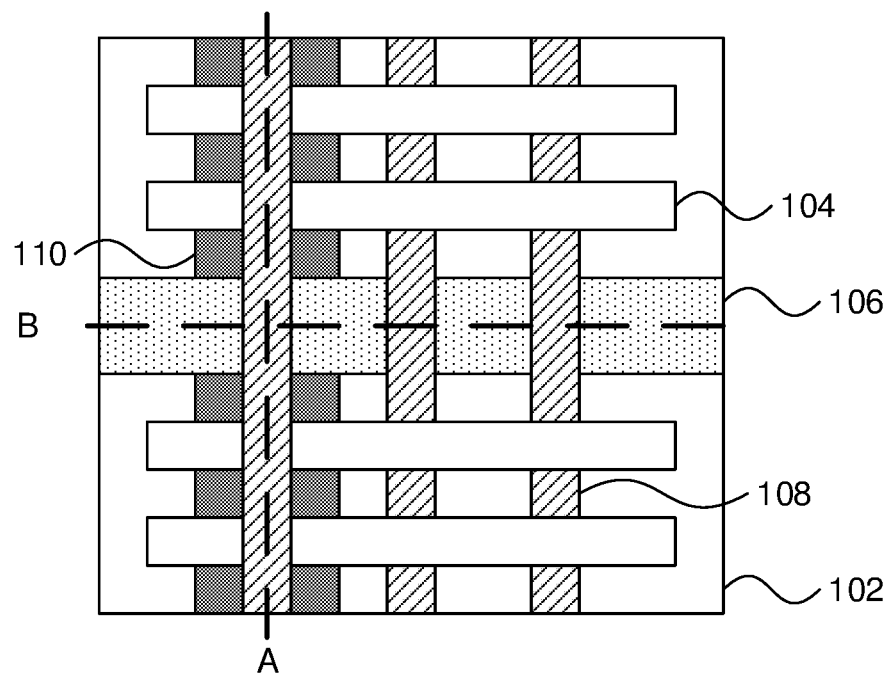
FIG. 1 is a top-down view of a step in the formation of fin field effect transistors (finFETs) using a gate cut process in accordance with an embodiment of the present invention.

Referring now to FIG. 1, a top-down view of a step in the fabrication of fin field effect transistors (FETs) is shown. The top-down view identifies two cross sections, A and B, which will be used in subsequent figures to describe the structures shown and subsequent processing steps. A semiconductor substrate 102 is shown having semiconductor fins 104. Shallow trench isolation (STI) areas 106 are formed between sets of fins. Gate structures 108 are formed over the fins 104. At this stage, it is specifically contemplated that the gate structures 108 are formed with a full gate stack. Source and drain regions 110 are formed for at least one of the gate structures 108.

The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

The fins 104 may be formed from the semiconductor substrate using, for example, photolithographic patterning and an anisotropic etch such as, e.g., reactive ion etching (RIE). RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Alternatively, the fins 104 can be formed by spacer imaging transfer, which is also known as sidewall image transfer. In sidewall image transfer processes, an initial sacrificial structure is formed at, for example, a smallest feature size that can be created using a given photolithographic technology. Spacer structures are then formed on sidewalls of the sacrificial structures using a conformal deposition process. These spacer structures can be made extremely thin (e.g., about 5 nm). The spacer structures are then used to pattern an underlying semiconductor layer (e.g., the semiconductor substrate 104) with an anisotropic etch, creating fins 104 having dimensions substantially smaller than the smallest feature size.

The STI regions 106 may be formed by etching a trench in the semiconductor substrate 102 using, for example, a dry etching process such as RIE or plasma etching. The trenches may optionally be lined with a conventional liner material such as, e.g., an oxide, and then the trench is filled with polysilicon or another like STI dielectric material. The STI dielectric may optionally be densified after deposition.

The source and drain structures 110 are specifically contemplated as being epitaxially grown, in situ doped semiconductors, but it should be understood that other embodiments are also contemplated that include formation and doping by, e.g., conformal deposition and ion implantation.

Figure 2:
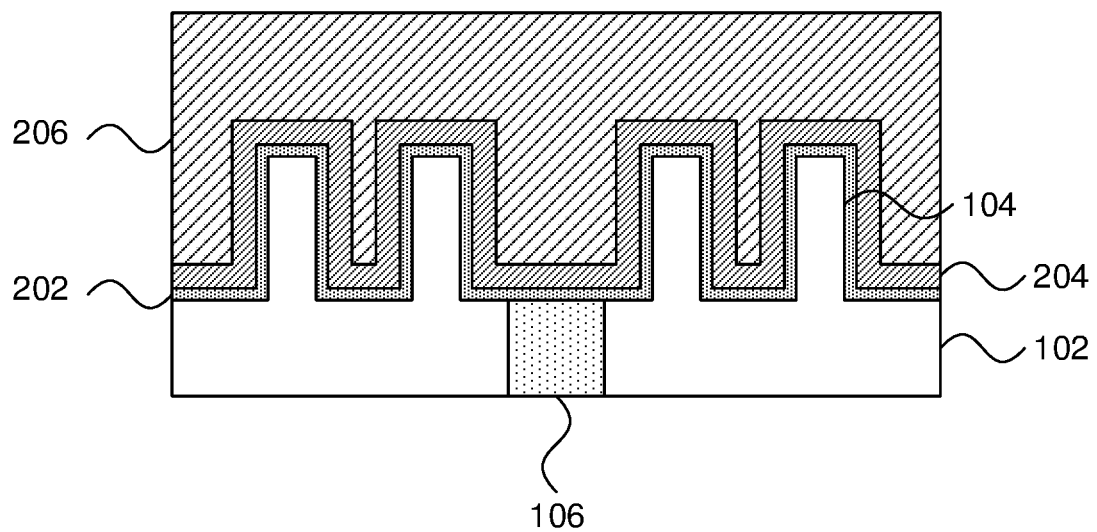
FIG. 2 is a cross-sectional view of a step in the formation of finFETs using a gate cut process showing a cross-section perpendicular to a length of the fins in accordance with an embodiment of the present invention.

Referring now to FIG. 2, a cross-sectional view of a step in the fabrication of fin FETs along cross-section A is shown. In this view, the gate structure 108 is revealed as being a full gate stack, with a gate dielectric layer 202, a work function metal layer 204, and a gate conductor 206.

It is specifically contemplated that the gate dielectric may be formed from a high-k dielectric material, though other dielectric materials may be used instead. A high-k dielectric material is defined herein as a material having a dielectric constant greater than that of silicon dioxide. Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric material may further include dopants such as lanthanum and aluminum.

The work function metal layer 204 may be a p-type work function metal layer or an n-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, a p-type work function metal layer may be formed from titanium nitride, titanium aluminum nitride, ruthenium, platinum, molybdenum, cobalt, and alloys and combinations thereof.

As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is formed from at least one of titanium aluminum, tantalum nitride, titanium nitride, hafnium nitride, hafnium silicon, or combinations thereof. It should be understood that titanium nitride may play the role of an n-type work function metal or a p-type work function metal, depending on the conditions of its deposition.

The gate conductor 206 may be formed from any appropriate conductive metal such as, e.g., tungsten, nickel, titanium, molybdenum, tantalum, copper, cobalt, platinum, silver, gold, ruthenium, iridium, rhenium, rhodium, and alloys thereof. The gate conductor 206 may alternatively be formed from a doped semiconductor material such as, e.g., doped polysilicon.

Figure 3:
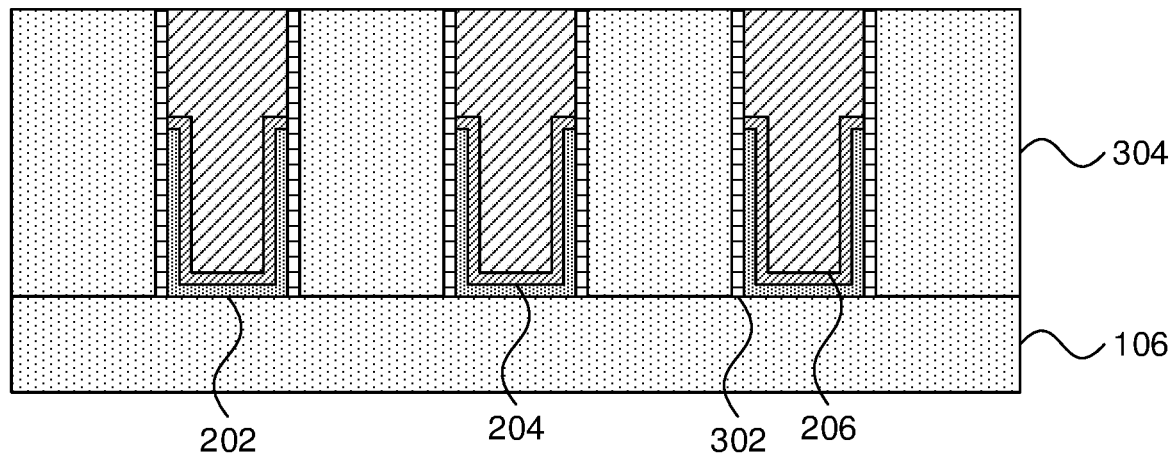
FIG. 3 is a cross-sectional view of a step in the formation of finFETs using a gate cut process showing a cross-section perpendicular to a length of the gate structures in accordance with an embodiment of the present invention.

Referring now to FIG. 3, a cross-sectional view of a step in the fabrication of fin FETs along cross-section B is shown. In this view, the structural relationship of the gate dielectric 202 and the work function metal layer 204 is shown, with the work function metal layer 204 extending over the top of the gate dielectric layer 202 to seal against the sidewall of the gate spacers 302. The gate spacers 302 may be formed from any appropriate dielectric material such as silicon nitride. An inter-layer dielectric 404 is filled in around the gate structures and polished down to the level of the gate conductor 206 using, e.g., a CMP process. The inter-layer dielectric 404 may be formed from any appropriate dielectric material such as, e.g., silicon dioxide.

CMP is performed using, e.g., a chemical or granular slurry and mechanical force to gradually remove upper layers of the device. The slurry may be formulated to be unable to dissolve, for example, the gate conductor material, resulting in the CMP process's inability to proceed any farther than that layer.

Figure 4:
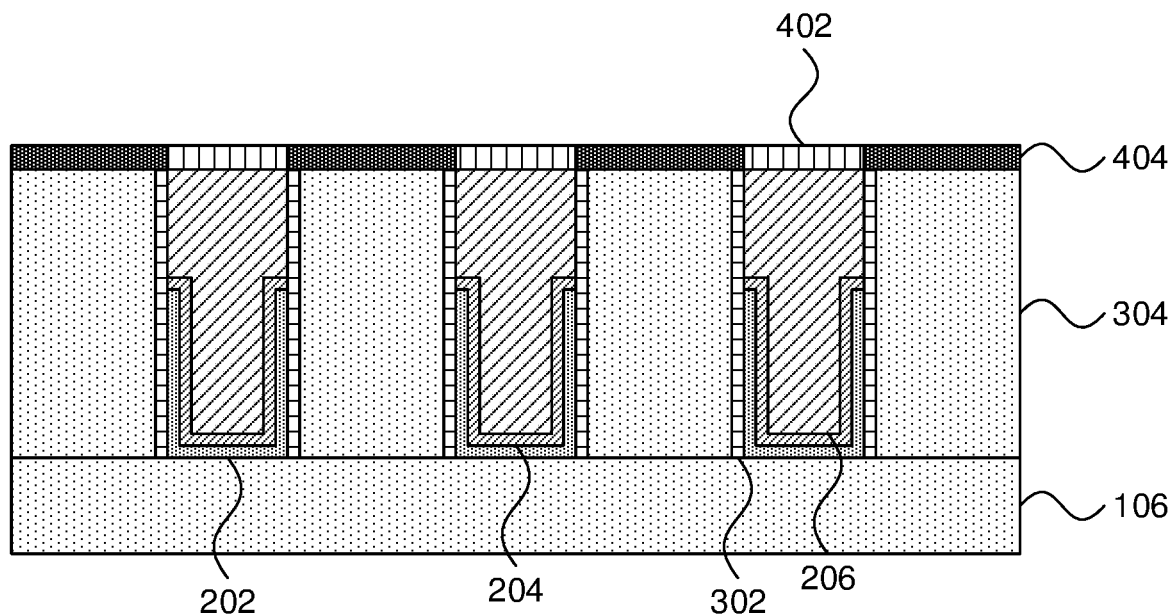
FIG. 4 is a cross-sectional view of a step in the formation of finFETs using a gate cut process showing formation of a self-assembled monolayer and a protective layer in accordance with an embodiment of the present invention.

Referring now to FIG. 4, a cross-sectional view of a step in the fabrication of fin FETs along cross-section B is shown. In one embodiment, a self-assembled monolayer 402 is selectively deposited on the gate conductor 206. The self-assembled monolayer 402 may have any appropriate chemistry where one end of a polymer chain binds to the surface of the gate conductor 206 (e.g., binds to a metal) without binding to dielectric surfaces of the interlayer dielectric 304 or the gate spacers 302. A single layer of the polymer is thereby formed solely on the gate conductor 206, leaving the dielectric surfaces exposed after the unbound polymer material is washed away. A protective layer 404 is then deposited on the exposed dielectric surfaces but does not bind to the self-assembled monolayer 402.

The self-assembled monolayer 402 may be formed using, e.g., thiols-RSH, RSR', phophonic acids, R3P, R2P=0, selenium acids, RSeH, RSeSeR', or alkyl or aryl organic chains. Self-assembled monolayers of organo sulfur compounds which bind to metals can be formed from thiols, disulfides, and sulfides and can form monolayers through adsorption from either a liquid or vapor phase. The sulfur-based functionality attaches to the metal, leaving the rest of the compound unbound. The self-assembled monolayer 402 then includes an organized layer of typically amphiphilic molecules. Generally a head group is connected to an alkyl chain, but could also include some aromatic moety, in which a tail end can be functionalized (e.g., to specify wetting and interfacial properties). The tail end may in particular be functionalized to prevent growth of the dielectric on the attached metal surface. A carbon chain length of the alkyl chain will, in some embodiments, be adjustable to maximize surface coverage on the metal. Self-assembled monolayers can also be formed from a mixture of thiols, asymmetric disulfides, and assymetric dialkylsulfides.

These substances will bind at one end to the gate conductor 206, leaving the unbound end free, resulting in an oriented single layer of the substance. The protective layer 404 may be formed from, e.g., hafnium dioxide using hafnium oxide precursors such as alkyl amide, alkoxide, diketonate, and chloride. Hafnium dioxide films may be deposited using, e.g., atomic layer deposition (ALD) from fluoride, hafnium tetraiodide, hafnium nitrate, hafnium tetrachloride, etrakis-ethylmethylamino hafnium, or alkoxide 3-Methyl-3-pentoxide. The hafnium dioxide may be selectively deposited on the exposed dielectric area through plasma based or thermal atomic layer deposition.

Figure 5:
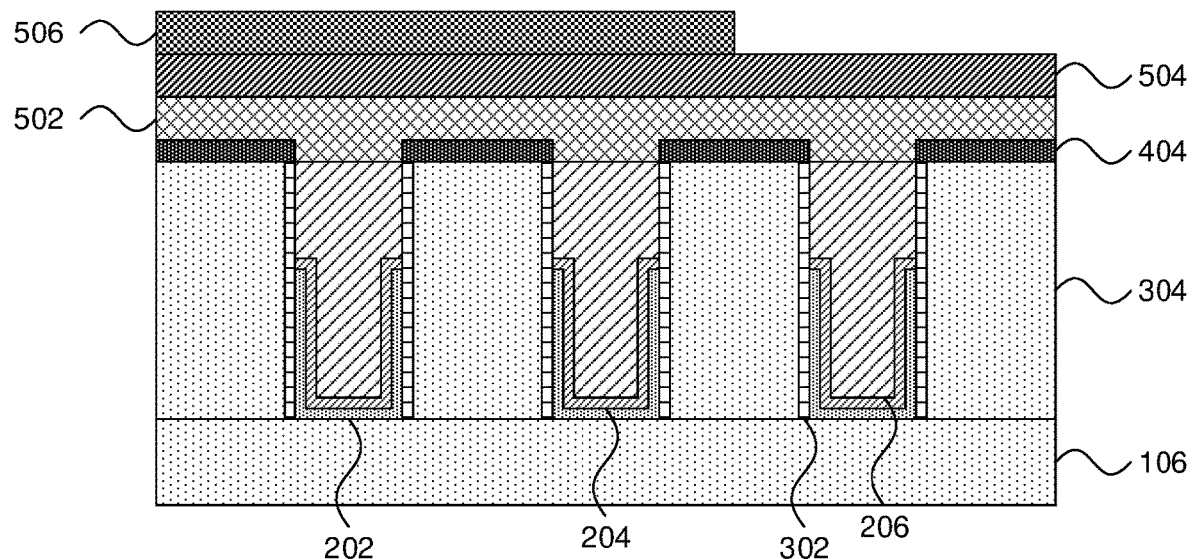
FIG. 5 is a cross-sectional view of a step in the formation of finFETs using a gate cut process showing formation of a lithography mask in accordance with an embodiment of the present invention.

Referring now to FIG. 5, a cross-sectional view of a step in the fabrication of fin FETs along cross-section B is shown. The self-assembled monolayer 402 is ashed away with a plasma etch, leaving the gate conductor 206 exposed. A tri-layer of an organic planarizing layer 502, an anti-reflection coating 504, and a resist layer 506 are deposited by any appropriate deposition process including, e.g., chemical vapor deposition (CVD), physical vapor deposition (PVD), atomic layer deposition (ALD), gas cluster ion beam (GCIB) deposition, or spin-on deposition. It is specifically contemplated that the anti-reflection coating 504 may be formed from titanium oxide/titanium, which will be etched in the subsequent etch of the gate conductor 206 and work function metal layer 204. The resist layer 506 is lithographically etched to provide the gate cut pattern, leaving open an area where further etching will take place.

The gate dielectric layer 502 may be formed by any appropriate process including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 6:
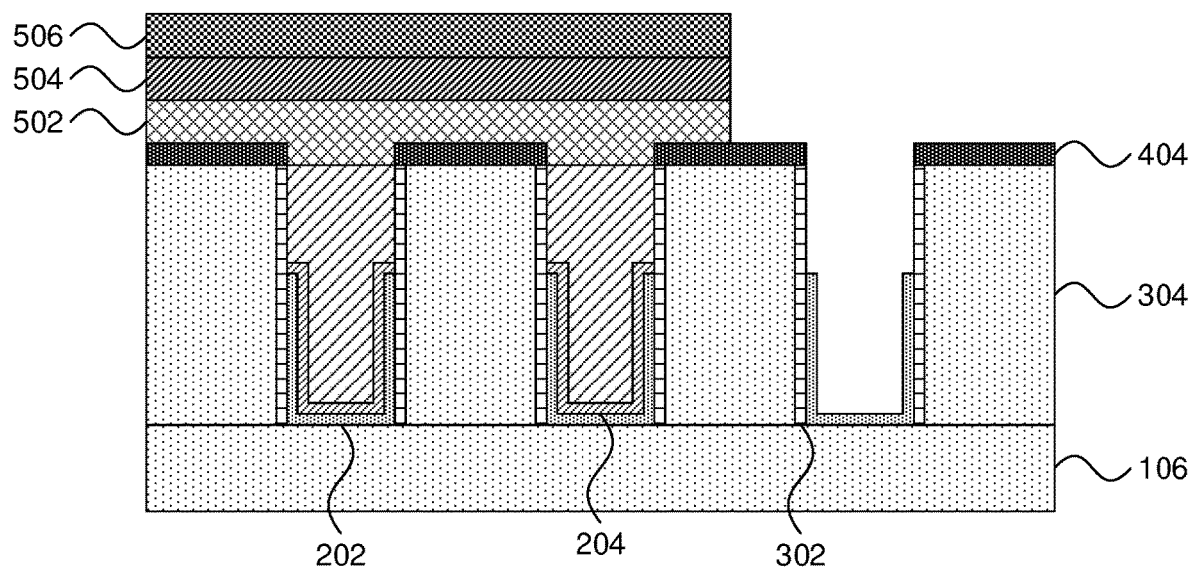
FIG. 6 is a cross-sectional view of a step in the formation of finFETs using a gate cut process showing a gate stack being etched away in accordance with an embodiment of the present invention.

Referring now to FIG. 6, a cross-sectional view of a step in the fabrication of fin FETs along cross-section B is shown. The anti-reflection coating 204, organic planarizing layer 202, gate conductor 206, and work function metal layer 204 are etched away in the area exposed by the resist layer 506 using one or more anisotropic etches such as, e.g., RIE. An additional sidewall spacer may be deposited after the etch of the organic planarizing layer 502 and before etching the gate conductor 206 to prevent an undercut of the organic planarizing layer 502 during the subsequent etch(es). Damage to the interlayer dielectric 304 and the spacers 302 is prevented by the protective layer 404. Experiments have shown that a protective layer as thin as about 1.5 nm is sufficient to protect the dielectric structures during an anisotropic etch of the work function metal layer 204 and gate conductor 206 that removes more than about 80 nm of said materials. In some embodiments the gate dielectric 202 may also be etched using a selective wet or dry etch to strip the gate dielectric 202 without recessing interlayer dielectric or undercutting other materials more than a few nanometers. In some embodiments, the protective layer 404 may also be etched using a selective wet or dry etch to strip the protective layer 404 without recessing interlayer dielectric or undercutting other materials more than a few nanometers.

Figure 7:
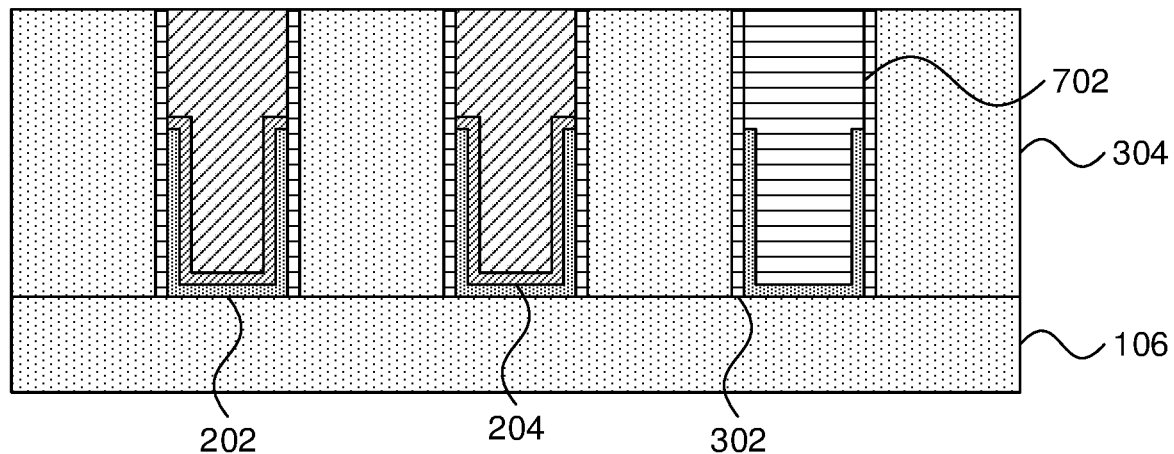
FIG. 7 is a cross-sectional view of a step in the formation of finFETs using a gate cut process showing a dielectric liner being formed in the place of the etched-away gate stack in accordance with an embodiment of the present invention.

Referring now to FIG. 7, a cross-sectional view of a step in the fabrication of fin FETs along cross-section B is shown. The remaining resist layer 506, anti-reflective coating 504, and organic planarizing layer 502 are removed, along with the protective layer 404. A dielectric liner 702 is deposited in the space left by the etched-away gate conductor 206 and may be formed from, e.g., silicon nitride. It should be understood that the protective layer 404 may be removed before or after the formation of the dielectric liner 702. A CMP process is used to polish the dielectric liner 702 down to the level of the interlayer dielectric 304. At this stage the top surface of the interlayer dielectric 304 exhibits no divots or recesses that would result from performing the previous anisotropic etch without having a protective layer 404.

At this stage, subsequent processing steps may be performed to recess the remaining gate conductors 206 and to form a self-aligned contact cap, as well as conductive contacts to the gate conductors 206 and the source/drain regions 110. It should be understood that the formation of an interlayer dielectric 304 that lacks recesses at the top surface can also be accomplished without a self-assembled monolayer if the protective layer 404 can be selectively deposited on only the interlayer dielectric 304 (or on only the interlayer dielectric 304 and the spacer 302) taking advantage of different surface reactivities between materials.

Figure 8:
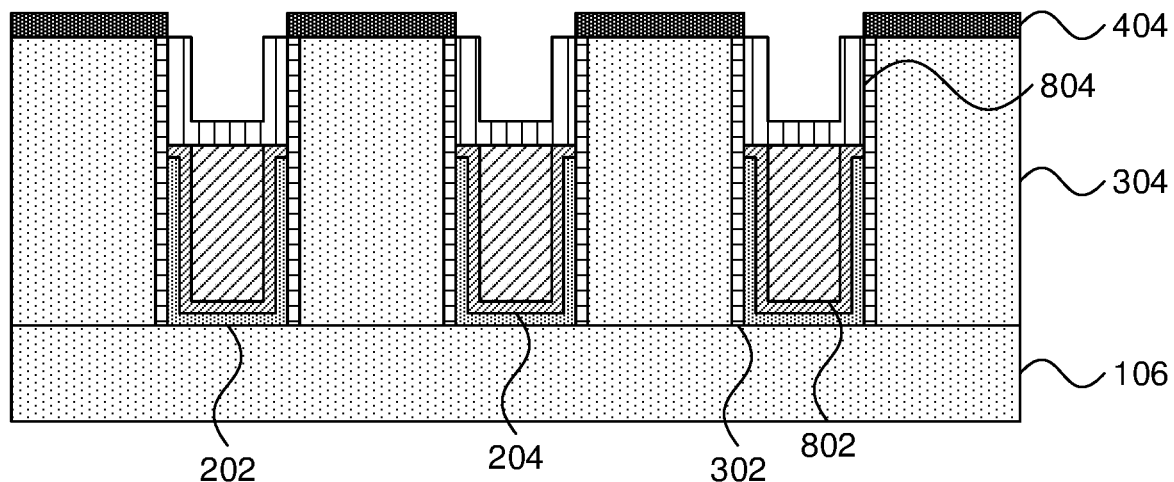
FIG. 8 is a cross-sectional view of a step in an alternative embodiment of the formation of finFETs using a gate cut process showing the gate stacks being recessed before the self-assembled monolayer is formed in accordance with an embodiment of the present invention.

Referring now to FIG. 8, a cross-sectional view of a step in an alternative embodiment of the fabrication of fin FETs along cross-section B is shown. In this embodiment, the gate contact 802 is recessed down to the level of the work function metal layer 204 before deposition of the self-aligned contact cap. This reduces the amount of etching needed and reduces the threat of etching through the protective layer 404 and into the interlayer dielectric 304.

The self-assembled monolayer 804 is deposited across the top surface of the recessed gate conductor 802 and the work function metal layer 204. A thin adhesion layer (not shown) may be formed on the sidewalls of the spacers 302 so that the self-assembled monolayer 804 will also accumulate on the sidewalls of the spacers 302. The adhesion layer may be formed from, e.g., titanium nitride, before formation of the gate conductor. When the gate conductor is subsequently recessed, a selective etch is used to preserve the adhesion layer. The anisotropic etch of one region's gate recessed gate conductor 802 and work function metal layer 204 then proceeds as described above, with the interlayer dielectric 304 being protected from the etch by the protective layer 404. Processing then continues, as described above, with dielectric liners being formed and conductive contacts being put in place.

In a further alternative embodiment, where the protective layer 404 is deposited only on the interlayer dielectric 304, the adhesion layer is omitted from the spacers 302 so that none of the self-assembled monolayer 804 accumulates thereon. Any damage to the spacers 302 is refilled by the subsequent deposition of the dielectric material for the dielectric liner or the self-aligned contact caps.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGei_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the contextclearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the ten "below" can encompass both an orientation of above and below. The device can be otherwise oriented (rotated 90 degrees or at other orientations and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 9:
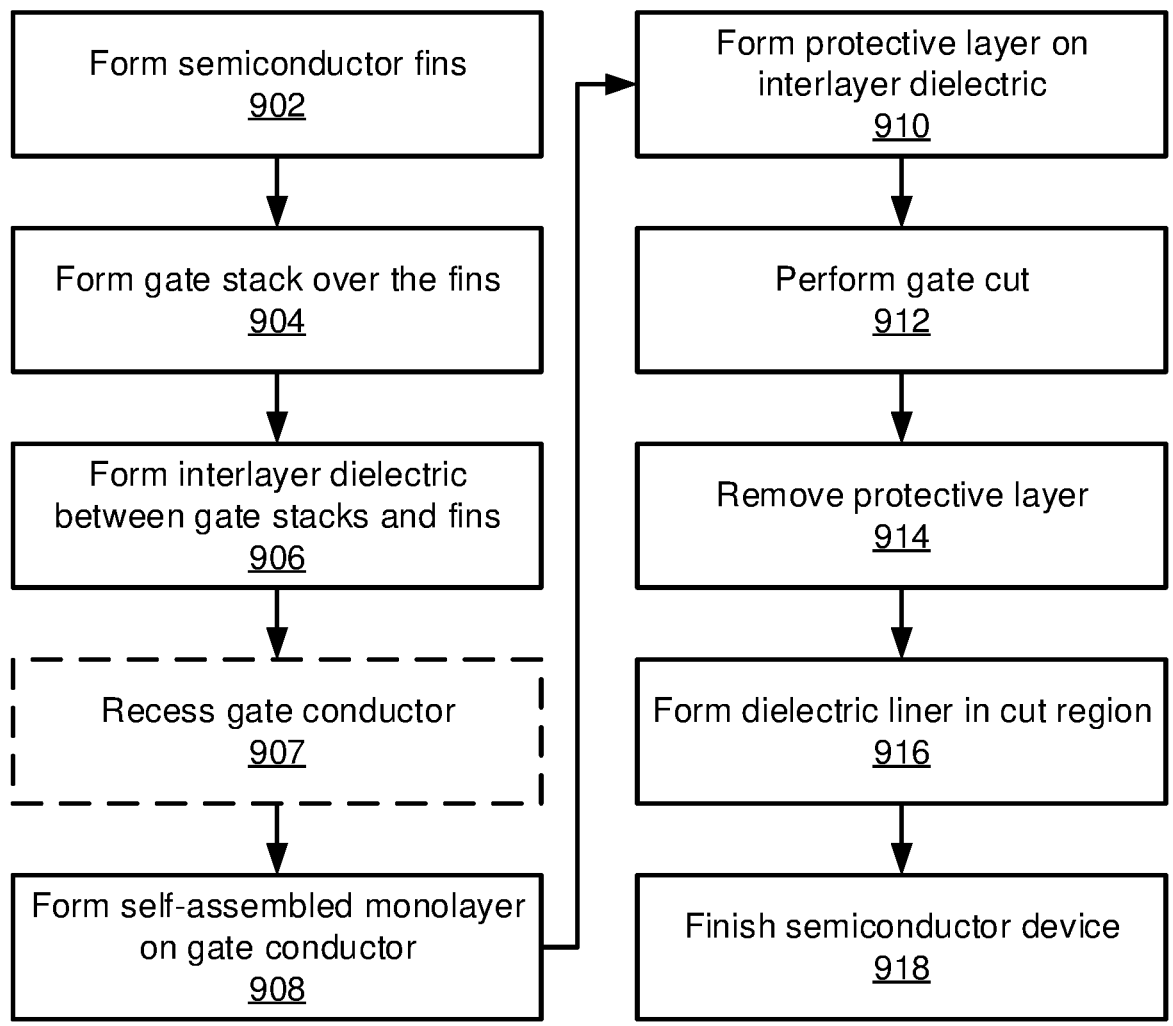
FIG. 9 is a block/flow diagram of a method for forming finFETs using a gate cut process in accordance with an embodiment of the present invention.

Referring now to FIG. 9, a method for fabricating fin FETs using a gate cut process is shown. Block 902 forms the semiconductor fins 104 on the semiconductor substrate 102. As noted above, the fins 104 may be formed by any appropriate anisotropic etch or by a sidewall image transfer process. The fins 104 may be formed by removing material from the semiconductor substrate 102 or may, alternatively, be formed by etching a separate layer on top of the semiconductor substrate and may, therefore, be formed from the same material as the substrate 102 or from a different material.

Block 904 forms a gate stack over the fins 104. In the present embodiments the gate stack may include a gate dielectric layer 202, a work function metal layer 204, and a gate conductor 204, but it should be understood that other gate stack configurations (e.g., lacking a work function metal layer 204 or having additional layers) may be used instead. The gate stack may be formed by successive deposition processes using any appropriate conformal deposition process.

Block 906 forms an interlayer dielectric 304 around the fins 104 and the gate stacks, filling such spaces and providing structural support and electrical isolation. It is specifically contemplated that a flowable oxide deposition by, e.g., a spin-on process may be used to form the interlayer dielectric 304. At this point, block 907 may optionally recess the gate conductor 206, but it should be understood that in other embodiments the gate conductor 206 may be recessed after formation of the dielectric liner in block 916.

Block 908 forms a self-assembled monolayer 402 on the exposed surface(s) of the gate conductor 206 using any appropriate self-assembling material that selectively binds to the metallic material of the gate conductor 206. Block 910 then forms protective layer 404 on exposed surfaces of the interlayer dielectric 304 from, e.g., hafnium dioxide. Because the material of the protective layer 404 does not bind to the self-assembled monolayer 402, the protective layer 404 is formed solely on the exposed dielectric material (optionally including the top surfaces of spacers 302).

Block 912 then performs the gate cut, using an anisotropic etch to remove the material of the gate conductor 206 and the work function metal layer 204 in at least one region. The protective layer 404 protects the top surface of the interlayer dielectric 304 from damage during this etch. Block 914 then removes the protective layer 404, revealing a top surface of the interlayer dielectric 304 with no recessing (though it should be understood that the protective layer 404 need not be stripped in all embodiments and may instead be left on the interlayer dielectric 304 to be removed in a later CMP process). Block 916 forms a dielectric liner in the cut region and optionally over recessed gate conductors 802.

Block 918 then finishes the device. This may include recessing the gate conductors 206, forming self-aligned contact caps over the recessed gate conductors, and forming electrical contacts by etching access holes through the interlayer dielectric 302 and the self-aligned contact caps and depositing a conductive material.

Having described preferred embodiments of a gate cut using selective deposition to prevent oxide loss (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
    a semiconductor fin;
    a gate stack, formed over the semiconductor fin, that includes a gate dielectric and a gate conductor;
    source and drain regions formed at respective sides of the gate stack;
    a dielectric liner, formed parallel to the gate stack, that includes a bottom layer, formed from a same material as the gate dielectric layer and a top layer formed from a second dielectric material; and
    an interlayer dielectric formed between the gate stack and the dielectric liner, wherein a top surface of the interlayer dielectric between the gate stack and the dielectric liner is not recessed, and wherein the bottom layer of the dielectric liner is formed conformally on the semiconductor fin and on sidewalls of the interlayer dielectric.

2. The semiconductor device of claim 1, wherein the material of the gate dielectric layer is a high-k dielectric material and wherein the second dielectric material is silicon nitride.

3. The semiconductor device of claim 1, wherein the bottom layer has sidewalls that have a top surface with a height that is that is lower than a height of a top surface of the top layer.

4. The semiconductor device of claim 2, wherein the gate conductor is recessed relative to the interlayer dielectric.

5. The semiconductor device of claim 4, further comprising a self-aligned contact cap over the gate conductor.

6. The semiconductor device of claim 2, wherein the gate stack further comprises a work function metal layer that encapsulates the gate dielectric.

7. A semiconductor device, comprising:
    a semiconductor fin;

a gate stack, formed over the semiconductor fin, that includes a gate dielectric layer and a gate conductor;

source and drain regions formed at respective sides of the gate stack;

a dielectric liner, formed parallel to the gate stack, that includes a bottom layer, formed from a same material as the gate dielectric layer and a top layer formed from a second dielectric material, wherein the bottom layer has sidewalls that have a top surface with a height that is that is lower than a height of a top surface of the top layer; and an interlayer dielectric, formed between the gate stack and the dielectric liner, wherein a top surface of the interlayer dielectric between the gate stack and the dielectric liner is not recessed.

8. The semiconductor device of claim 7, wherein the material of the gate dielectric layer is a high-k dielectric material and wherein the second dielectric material is silicon nitride.

9. The semiconductor device of claim 7, wherein the bottom layer is formed conformally on the semiconductor fin and on sidewalls of the interlayer dielectric.

10. The semiconductor device of claim 7, wherein the gate conductor is recessed relative to the interlayer dielectric.

11. The semiconductor device of claim 10, further comprising a self-aligned contact cap over the gate conductor.

12. A semiconductor device, comprising:
a semiconductor fin;
a gate stack, formed over the semiconductor fin, that includes a gate dielectric layer and a gate conductor;

source and drain regions formed at respective sides of the gate stack;

a dielectric liner formed parallel to the gate stack that includes a bottom layer, formed from a same material as the gate dielectric layer and conformally on the semiconductor fin and on sidewalls of the interlayer dielectric, and a top layer, forming from a second dielectric material; and an interlayer dielectric, formed between the gate stack and the dielectric liner, wherein a top surface of the interlayer dielectric between the gate stack and the dielectric liner is not recessed.

13. The semiconductor device of claim 12, wherein the material of the gate dielectric layer is a high-k dielectric material and wherein the second dielectric material is silicon nitride.

14. The semiconductor device of claim 12, wherein the bottom layer has sidewalls that have a top surface with a height that is that is lower than a height of a top surface of the top layer.

15. The semiconductor device of claim 12, wherein the gate conductor is recessed relative to the interlayer dielectric.

16. The semiconductor device of claim 15, further comprising a self-aligned contact cap over the gate conductor.

* * * * *